(12) United States Patent
Park et al.

(10) Patent No.: US 7,683,373 B2
(45) Date of Patent: Mar. 23, 2010

(54) THIN FILM TRANSISTOR AND METHOD OF FABRICATING THE SAME

(75) Inventors: Byoung-Keon Park, Incheon-si (KR); Jin-Wook Seo, Suwon-si (KR); Tae-Hoon Yang, Seongnam-si (KR); Ki-Yong Lee, Yongin-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 0 days.

(21) Appl. No.: 11/017,688

(22) Filed: Dec. 22, 2004

(65) Prior Publication Data

US 2006/0073648 A1 Apr. 6, 2006

(30) Foreign Application Priority Data

Oct. 5, 2004 (KR) ............... 10-2004-0079277

(51) Int. Cl.
*H01L 31/036* (2006.01)
(52) U.S. Cl. .................. 257/66; 257/E31.04
(58) Field of Classification Search .......... 257/65, 257/66, E31.04
See application file for complete search history.

(56) References Cited

U.S. PATENT DOCUMENTS 6,242,779 B1* 6/2001 Maekawa .................. 257/347
6,346,437 B1* 2/2002 Maekawa et al. ........... 438/166

FOREIGN PATENT DOCUMENTS

CN 1527405 A 6/2008

(Continued)

OTHER PUBLICATIONS

Notice of Allowance dated Nov. 6, 2008 (from co-pending U.S. Appl. No. 11/457,491).

*Primary Examiner*—Bradley K Smith
*Assistant Examiner*—Amar Movva
(74) *Attorney, Agent, or Firm*—H.C. Park & Associates, PLC

(57) ABSTRACT

Provided are a thin film transistor and method of fabricating the same, in which an amorphous silicon layer is formed on a substrate, a capping layer containing a metal catalyst having a different concentration according to its thickness is formed on the amorphous silicon layer, the capping layer is patterned to form a capping layer pattern, and the amorphous silicon layer is crystallized, such that the density and position of seeds formed at an interface between the amorphous silicon layer and the capping layer pattern is controlled, thereby improving the size and uniformity of grains, and in which polycrystalline silicon of desired size and uniformity is selectively formed at a desired position by one crystallization process, resulting in a thin film transistor having excellent and desired properties. The thin film transistor includes a substrate; a plurality of semiconductor layers formed on the substrate, the semiconductor layers including grains of different sizes obtained by crystallizing an amorphous silicon layer beneath a capping layer into a polycrystalline silicon layer using the capping layer pattern containing a metal catalyst with a predetermined distribution and having a predetermined height and width; and a gate insulating layer, a gate electrode, an interlayer insulting layer, and source and drain electrodes formed on the semiconductor layers. Therefore, the crystallization process is performed using the capping layer pattern containing the metal catalyst, which has concentration and distribution varying depending on the thickness of the capping layer pattern, thereby improving the size and uniformity of grains. In addition, the polycrystalline silicon of desired size and uniformity is selectively formed in a desired position by one crystallization process, resulting in the thin film transistor having excellent and desired properties.

5 Claims, 7 Drawing Sheets

FOREIGN PATENT DOCUMENTS

| | | |
|---|---|---|
| JP | 05-347262 | 12/1993 |
| JP | 07-273027 | 10/1995 |
| JP | 08-097137 | 4/1996 |
| JP | 2000-228360 | 8/2000 |
| JP | 2000-299284 | 10/2000 |
| KR | 10-2002-0077278 | 10/2002 |
| KR | 10-2003-0015617 | 2/2003 |
| KR | 10-2003-0060403 A | 7/2003 |
| KR | 10-2004-0045236 | 6/2004 |

* cited by examiner 103a 102 101

THIN FILM TRANSISTOR AND METHOD OF FABRICATING THE SAME

CROSS-REFERENCE TO RELATED APPLICATION

This application claims priority to and the benefit of Korean Patent Application No. 2004-79277, filed Oct. 5, 2004, the contents of which are incorporated herein by reference in their entirety.

BACKGROUND OF THE INVENTION

1. Field of the Invention

The present invention relates to a thin film transistor and method of fabricating the same and, more particularly, to a thin film transistor and method of fabricating the same, in which an amorphous silicon layer is formed on a substrate, a capping layer containing a metal catalyst having a different concentration according to its thickness is formed on the amorphous silicon layer, the capping layer is patterned to form a capping layer pattern, and the amorphous silicon layer is crystallized, such that the density and position of seeds formed at an interface between the amorphous silicon layer and the capping layer pattern is controlled, thereby improving the size and uniformity of grains, and in which polycrystalline silicon of desired size and uniformity is selectively formed at a desired position by one crystallization process, resulting in a thin film transistor having excellent and desired properties.

2. Description of Related Art

Generally, a polycrystalline silicon layer is being widely used as a semiconductor layer for a thin film transistor because the polycrystalline silicon layer has high field effect mobility, is applicable to a high-speed operation circuit and may implement a CMOS circuit configuration. The thin film transistor with the polycrystalline silicon layer is primarily used for an active device of an active matrix liquid crystal display (AMLCD), a switching device and a driving device of a flat panel display device such as an organic light emitting display (OLED).

The polycrystalline silicon layer for use in the thin film transistor is typically fabricated by a technique using high-temperature annealing, a laser annealing method, or the like after an amorphous silicon layer is deposited. In the laser annealing method, a low-temperature process is possible and high field effect mobility is achieved, but expensive laser equipment is required. Accordingly, alternative techniques have been extensively studied.

Presently, a method of crystallizing amorphous silicon using metal catalyst is being extensively studied because of its advantage of fast crystallization at a lower temperature compared to a solid phase crystallization method annealing for long-time at a high temperature for the crystallization. The crystallization method using the metal catalyst may be classified into a metal induced crystallization method and a metal induced lateral crystallization method. However, there is a problem with the methods using the metal catalyst that leakage current increases due to metal contamination, thereby deteriorating the properties of a thin film transistor.

Meanwhile, there are a technique of forming a good quality of polycrystalline silicon layer by adjusting the concentration of metal ions using an ion implanter and applying high-temperature treatment, rapid annealing, or laser irradiation in order to form a good quality polycrystalline silicon layer having a reduced amount of the metal catalyst, and a metal induced crystallization method of blending an organic layer having viscosity and a metal catalyst in a liquid state in order to planarize the surface of a polycrystalline silicon layer, and of depositing a thin film using a spin coating method and then crystallizing the thin film using an annealing process. However, even this crystallization method has a problem in obtaining a large sized and uniform grain that is the most important feature in the polycrystalline silicon layer.

A method of fabricating a polycrystalline silicon layer by a crystallization method using a capping layer was developed to solve the aforementioned problem, as described in Korean Laid-open Patent No. 2003-0060403. In this method, a metal catalyst layer is formed on a substrate, a capping layer is formed on the metal catalyst layer, and then an amorphous silicon layer is formed on the capping layer. The metal catalyst is diffused into the amorphous silicon layer through the capping layer by annealing or laser to form seeds, and a polycrystalline silicon layer is obtained using the seeds. The method has an advantage capable of preventing metal contamination because the diffusion of the metal catalyst is made through the capping layer.

However, with this crystallization method, it is difficult to control the concentration of the metal catalyst uniformly and to control crystallization position and grain size. In particular, it is difficult to pattern the metal catalyst layer uniformly since the metal is catalyst may be not protected when the metal catalyst layer is patterned.

SUMMARY OF THE INVENTION

The present invention, therefore, solves aforementioned problems associated with conventional devices by providing a thin film transistor and method of fabricating the same, in which an amorphous silicon layer is formed on a substrate, a capping layer containing a metal catalyst having a different concentration according to its thickness is formed on the amorphous silicon layer, the capping layer is patterned to form a capping layer pattern, and the amorphous silicon layer is crystallized, such that the density and position of seeds formed at an interface between the amorphous silicon layer and the capping layer pattern is controlled, thereby improving the size and uniformity of grains, and in which polycrystalline silicon of desired size and uniformity is selectively formed at a desired position by one crystallization process, resulting in a thin film transistor having excellent and desired properties.

In an exemplary embodiment of the present invention, a thin film transistor includes: a substrate; a plurality of semiconductor layers formed on the substrate, the semiconductor layers including grains of different sizes obtained by crystallizing an amorphous silicon layer beneath a capping layer into a polycrystalline silicon layer using the capping layer pattern containing a metal catalyst with a predetermined distribution and having a predetermined height and width; and a gate insulating layer, a gate electrode, an interlayer insulating layer, and source and drain electrodes formed on the semiconductor layers.

In another exemplary embodiment of the present invention, a method of fabricating a thin film transistor includes: preparing a substrate; forming an amorphous silicon layer on the substrate; forming a capping layer containing a metal catalyst on the amorphous is silicon layer; patterning the capping layer; and annealing the substrate to crystallize the amorphous silicon layer into a polycrystalline silicon layer.

The method further includes: after the crystallization, removing the capping layer; patterning the polycrystalline silicon layer to form a semiconductor layer; and forming a gate insulating layer, a gate electrode, an interlayer insulating layer, and source and drain electrodes on the substrate.

Forming the capping layer containing the metal catalyst on the amorphous silicon layer includes: forming a first capping layer on the amorphous silicon layer; forming a metal catalyst layer on the first capping layer; and forming a second capping layer on the metal catalyst layer.

Forming the capping layer containing the metal catalyst on the amorphous silicon layer includes: simultaneously depositing a material for forming the capping layer and the metal catalyst on the amorphous silicon layer to form the capping layer containing the metal catalyst.

Forming the capping layer containing the metal catalyst on the amorphous silicon layer includes: depositing only the capping layer forming material during the formation of a predetermined thickness on the amorphous silicon layer to form the capping layer containing no metal catalyst, and then simultaneously depositing the capping layer forming material and the metal catalyst to form the capping layer containing the metal catalyst over a predetermined thickness.

Forming the capping layer containing the metal catalyst on the amorphous silicon layer includes: forming the capping layer on the amorphous silicon layer; and implanting the metal catalyst into the capping layer using an ion implantation process.

BRIEF DESCRIPTION OF THE DRAWINGS

The above and other features of the present invention will be described in reference to certain exemplary embodiments thereof with reference to the attached drawings in which.

DETAILED DESCRIPTION OF THE INVENTION

Figure 1:
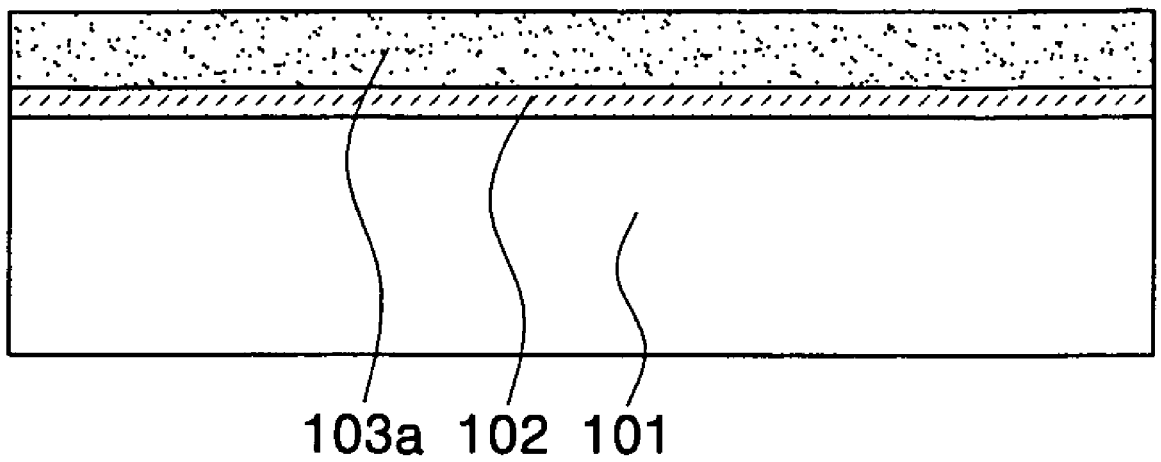
FIG. 1 is a cross-sectional view of a process of forming a buffer layer and an amorphous silicon layer on a substrate.

The present invention will now be described more fully hereinafter with reference to the accompanying drawings, in which exemplary embodiments of the invention are shown. In the drawings, the thickness of the layers and regions are exaggerated for clarity.

FIG. 1 is a cross-sectional view of a process of forming a buffer layer and an amorphous silicon layer on a substrate. As shown in FIG. 1, a buffer layer 102, which is a single is layer or a multi-layer, is formed of an insulating layer such as a silicon oxide layer or a silicon nitride layer on an insulating substrate 101, such as glass or plastic. The buffer layer 102 serves to prevent diffusion of moisture or impurity created in the underlying substrate or to adjust a heat transfer speed upon crystallization so that the amorphous silicon layer is well crystallized.

An amorphous silicon layer 103a is then formed on the buffer layer 102. At this time, a chemical vapor deposition or physical vapor deposition method may be used to form the amorphous silicon layer 103a. Further, a process may be performed to reduce the concentration of hydrogen by means of dehydrogenation when and after the amorphous silicon layer 103a is formed.

FIGS. 2a to 2d are cross-sectional views of a process of forming a capping layer containing a metal catalyst on the amorphous silicon layer.

Figure 2A:
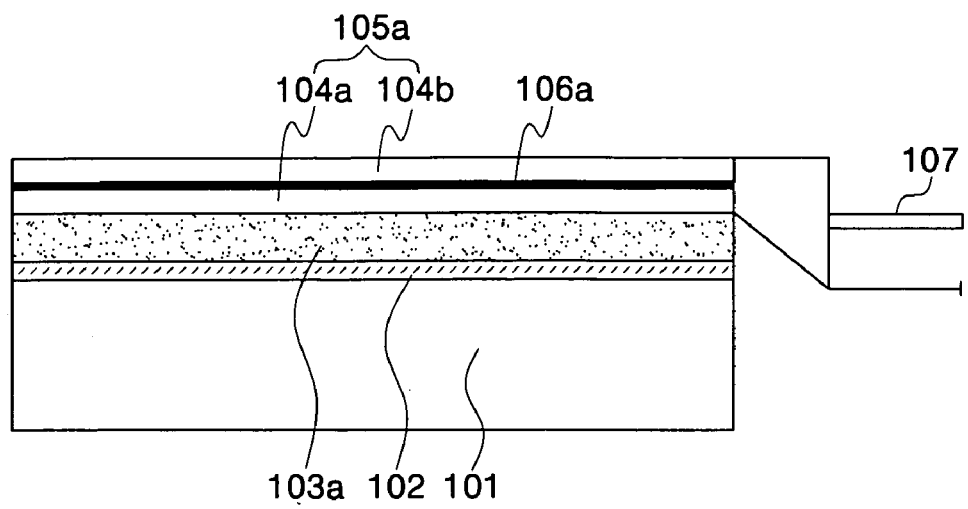
FIGS. 2a to 2d are cross-sectional views of a process of forming a capping layer containing a metal catalyst on the amorphous silicon layer.

FIG. 2a is a cross-sectional view of a process of forming a capping layer containing a metal catalyst on the amorphous silicon layer according to an exemplary embodiment of the present invention. As shown in FIG. 2a, a first capping layer 104a is formed of a silicon oxide layer or a nitride layer on a substrate having the amorphous silicon layer using a chemical vapor deposition or physical vapor deposition method.

A metal catalyst is then deposited at a surface density of $10^{11}$ to $10^{15}$ atoms/cm$^2$ on the first capping layer 104a using the chemical vapor deposition or the physical vapor deposition method, resulting in a metal catalyst layer 106a. At this time, at least one of Ni, Pd, Ti, Ag, Au, Al, Sn, Sb, Cu, Co, Mo, Tr, Ru, Rh, Cd and Pt and, preferably, a nickel (Ni) may be used as the metal catalyst for forming the metal catalyst layer 106a. Forming the metal catalyst layer using the nickel is desirable because the nickel facilitates crystallization of the amorphous silicon layer to a polycrystalline silicon layer.

A second capping layer 104b is then formed of a silicon oxide layer or a silicon nitride layer on the metal catalyst layer 106a using the chemical vapor deposition or the physical vapor deposition method, resulting in a capping layer 105a including the metal catalyst.

From a graph 107 of FIG. 2a representing the concentration of the metal catalyst in the capping layer, it can be seen that the concentration is 100% at the metal catalyst layer between the first capping layer and the second capping layer. Accordingly, it is possible to subsequently adjust the amount, position or density of the seeds inducing the crystallization of the amorphous silicon layer by adjusting the surface density or deposition amount of the metal catalyst layer. At this time, in the concentration graph of the metal catalyst, an x-axis indicates the concentration of the metal catalyst in the capping layer, and a y-axis indicates a distance from the interface between the amorphous silicon layer and the capping layer, i.e., the thickness of the capping layer.

Figure 2B:
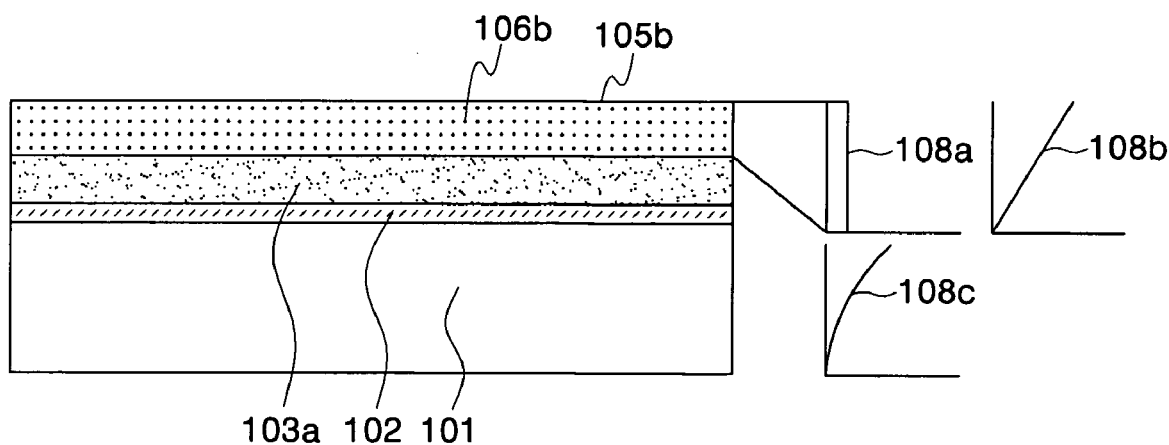

FIG. 2b is a cross-sectional view of a process of forming a capping layer containing a metal catalyst on the amorphous silicon layer according to another exemplary embodiment of the present invention. As shown in FIG. 2b, a metal catalyst is simultaneously implanted in such a manner that the metal catalyst is uniformly distributed in the capping layer when the capping layer is formed using a chemical vapor deposition apparatus or a physical vapor deposition apparatus, thereby forming a capping layer 105b containing the uniformly distributed metal catalyst 106b.

A graph 108a of FIG. 2b, representing the concentration of the metal catalyst in the capping layer, shows a constant density over the thickness of the capping layer since the metal catalyst is uniformly distributed in the capping layer. The formation of the capping layer while implanting the metal catalyst makes it possible to adjust the density of the metal catalyst by adjusting the implantation amount or speed of the metal catalyst while maintaining the capping layer forming speed constant, or to adjust the density of the metal catalyst in the capping layer by adjusting the capping layer forming speed while maintaining the implantation amount or speed of the metal catalyst constant, in order to obtain the above-stated uniform distribution.

Further, as shown in other metal catalyst concentration graphs 108b and 108c, representing the density or amount of the metal catalyst in the capping layer, the density or amount of the capping layer may be increased progressively or exponentially according to the thickness of the capping layer.

As described above, it is possible to adjust the position, amount, or density of the seeds, which are crystal nuclei, by adjusting the density or amount of the metal catalyst in the capping layer.

Figure 2C:
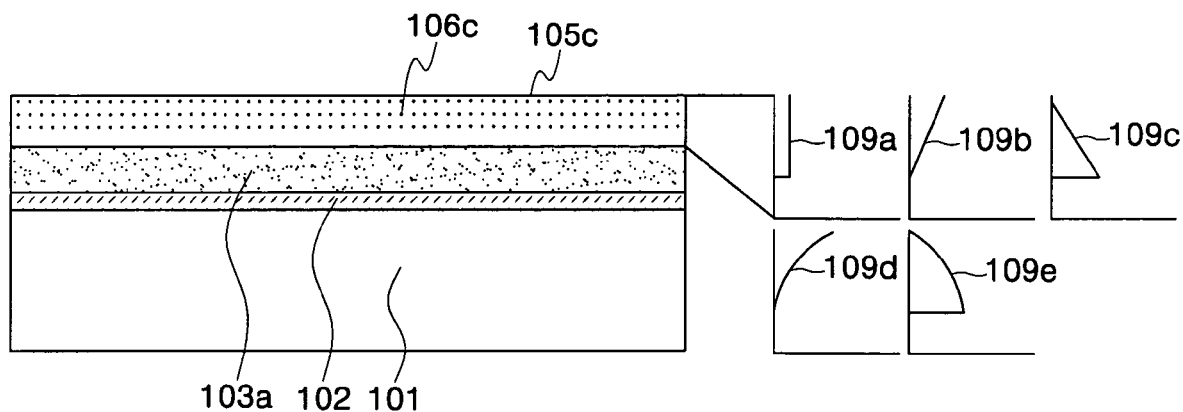

FIG. 2c is a cross-sectional view of a process of forming a capping layer containing a metal catalyst on the amorphous silicon layer according to another exemplary embodiment of the present invention. As shown in FIG. 2c, a metal catalyst is not implanted until a predetermined thickness is formed on the amorphous silicon layer and the metal catalyst is implanted after a certain thickness or more is formed using a chemical vapor deposition apparatus or a physical vapor deposition apparatus, thereby forming a capping layer 105c containing the metal catalyst 106c only within a predetermined thickness or more.

At this time, as shown in graphs 109a, 109b, 109c, 109d and 109e representing the concentration of the metal catalyst in the capping layer, the capping layer may be formed to have a constant, progressively increasing, progressively decreasing, exponentially increasing, or exponentially decreasing concentration of the metal catalyst after a predetermined thickness of the capping layer is formed.

Figure 2D:
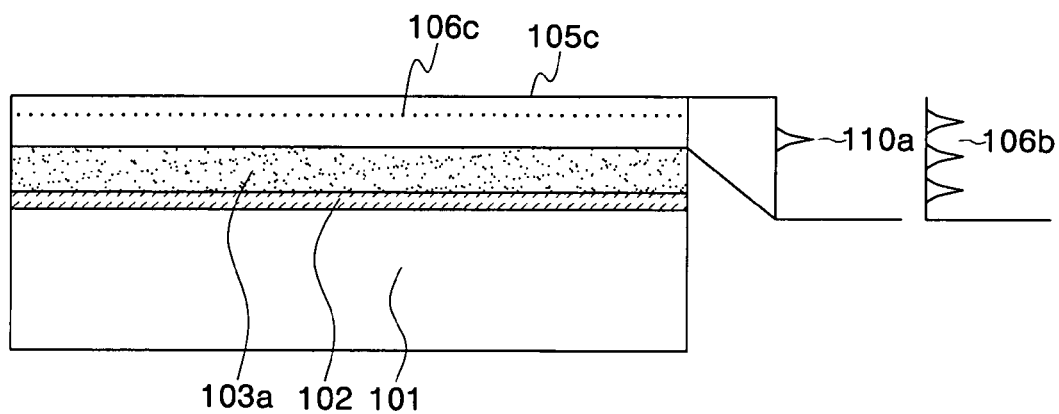

FIG. 2d is a cross-sectional view of a process of forming a capping layer containing a metal catalyst on the amorphous silicon layer according to another exemplary embodiment of the present invention. As shown in FIG. 2d, a capping layer 105d is formed on the amorphous silicon layer using a chemical vapor deposition apparatus or a physical vapor deposition apparatus.

A metal catalyst 106d is then implanted at a predetermined position in the capping layer by an ion implantation process so that the metal catalyst exists in a predetermined thickness range of the capping layer.

At this time, as shown in the graphs 110a and 110b of FIG. 2d representing the concentration of the metal catalyst in the capping layer, it is possible to form only one region containing the metal catalyst by one ion implantation process, or to form two or more regions containing the metal catalyst by two or more ion implantation processes.

Thus, the capping layer containing the metal catalyst may be formed by the several methods described in FIGS. 2a to 2d, in which the producing position, density or distribution of the seeds needed for the crystallization as well as a process of patterning the capping layer may be controlled by properly controlling the amount, density or distribution of the metal catalyst.

It is preferable that the capping layer containing the metal catalyst is formed to a thickness of 5 to 2000 Å.

Figure 3A:
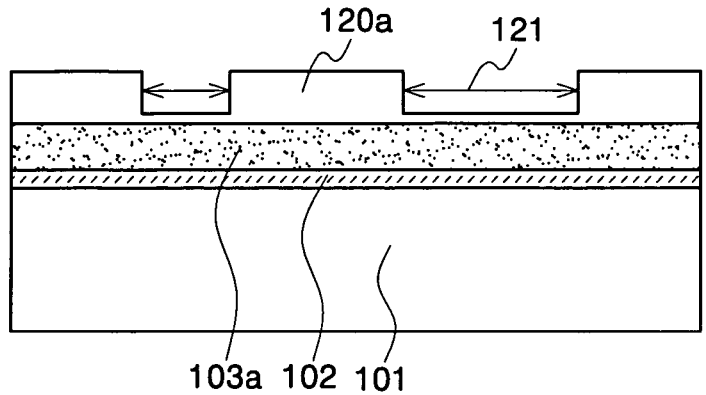
FIGS. 3a to 3c are cross-sectional views of a process of patterning the capping layer containing the metal catalyst to form a variety of capping layer patterns.
Figure 3B:
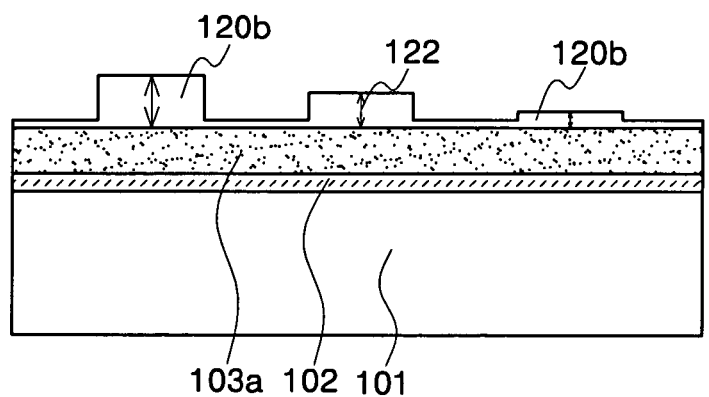
Figure 3C:
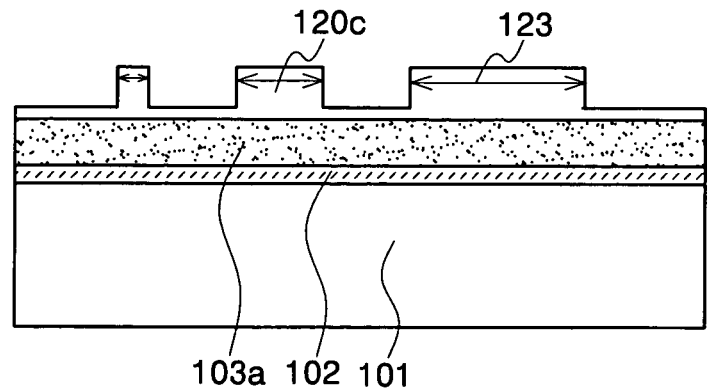

FIGS. 3a to 3c are cross-sectional views of a process of patterning the capping layer containing the metal catalyst to form a variety of capping layer patterns.

FIG. 3a is a cross-sectional view of capping layer patterns formed to have different intervals by controlling intervals between patterns of a pattern mask. As shown in FIG. 3a, capping layers 105a, 105b, 105c or 105d are patterned to form a capping layer pattern 120a using a pattern mask or a photoresist pattern. At this time, intervals 121 between the capping layer patterns are adjusted when forming the capping layer patterns.

In the case where the capping layer patterns are formed with the adjusted intervals therebetween, the size and uniformity of a grain in an amorphous silicon layer beneath a region having the capping layer pattern is determined by seeds formed by the capping layer patterns while the size and uniformity of a grain in an amorphous silicon layer beneath a region having no capping layer pattern (hereinafter, referred to as "non-pattern region") is greatly influenced by the size and uniformity of a grain in neighboring capping layer patterns as well as a distance between the neighboring capping layer patterns. In other words, the amorphous silicon layer beneath the capping layer patterns results in a polycrystalline silicon layer having the size and uniformity determined by the seeds, which are formed by the density or distribution of the metal catalyst present in the capping layer pattern, while the amorphous silicon layer beneath the non-pattern region has crystallinity determined by side propagation of the crystallinity of a polycrystalline silicon layer formed by the closest capping layer pattern, wherein the size and uniformity of the grain is influenced by the seeds in the capping layer patterns as well as by the intervals between the capping layer patterns, i.e., propagation distances of the crystallinity. Accordingly, it is possible to control the crystallization of the amorphous silicon layer by controlling the distances between the patterns.

It is preferable that the intervals between the capping layer patterns are 3 to 400 μm. This is because the polycrystalline silicon layer formed between the capping layer pattern and the neighboring capping layer pattern is used to form a semiconductor layer or is used as an electrode of a capacitor. That is, a narrow interval between the capping layer patterns (i.e., 3 μm or less) makes it difficult to form elements such as, for example, the semiconductor layer and the electrode of the capacitor, while a too wide interval therebetween (400 μm or more) makes it difficult to crystallize the amorphous silicon layer, or requires too much process time.

FIG. 3b is a cross-sectional view of capping layer patterns formed to have different thicknesses using several patterning methods. As shown in FIG. 3b, the capping layers 105a, 105b, 105c or 105d are patterned into capping layer patterns 120b using a pattern mask or a photoresist pattern. At this time, the capping layer patterns 120b are formed to the adjusted thickness of the capping layer 122.

At this time, the thicknesses of the capping layer patterns greatly affect the amount, density and distribution of the metal catalyst. That is, the amount or density of the metal catalyst is changed by the thickness of the capping layer, as described in FIGS. 2a to 2d. Accordingly, if the thickness of the capping layer pattern is changed (i.e., patterned and diminished), the amount of the metal catalyst is greatly changed. As a result, the seeds, inducing the crystallization, are influenced by the density of the metal catalyst in the capping layer as well as the thickness of the capping layer pattern, which makes it possible to control the crystallization more accurately.

At this time, the method of forming the capping layer pattern with different thicknesses may include, for example, a method of using a halftone mask or forming a mask in part and performing the blanket etch to adjust the thickness of the capping layer pattern.

At this time, it is possible to completely eliminate the thickness of the capping layer pattern by etching the capping layer, which is formed by the method as described in FIGS. 2a to 2d, or to use the formed capping layer as it is without etching the capping layer. That is, it is possible to variously adjust the thickness of the capping layer pattern as necessary, since the thickness is closely associated with the amount or density of the metal catalyst present in the capping layer pattern after the capping layer pattern is formed.

FIG. 3c is a cross-sectional view of capping layer patterns formed to have different widths. As shown in FIG. 3c, the capping layer patterns 120c are formed to have different widths 123 using a mask or a photoresist pattern.

If the capping layer patterns are formed to have different widths as stated above, the densities of the metal catalysts contained in the respective capping layer patterns are similar to each other while the amounts of the metal catalysts (which are proportional to the volume of the capping layer patterns when the respective capping layer patterns have the same density) are different from each other. Accordingly, the number of the seeds produced in a region beneath the capping layer patterns increases with the widths of the capping layer patterns.

Further, when the capping layer patterns have widths less than a predetermined size, only one seed will be produced beneath the capping layer patterns and thus the amorphous silicon layer beneath the capping layer patterns becomes a single crystalline region having only one grain. The amorphous silicon layer adjacent to the single crystalline region (i.e., the amorphous silicon layer beneath the non-pattern region) is also crystallized by the propagation of the crystallinity of the single crystalline region, thereby obtaining a polycrystalline silicon layer having excellent crystallinity over the overall substrate.

It is preferable that the capping layer patterns are formed to widths of 1 to 20 μm. This is because the widths of the capping layer patterns directly affect the amount of the metal catalyst, which in turn affects the crystallization. Further, too large width of the capping layer pattern greatly increases the amount of the metal catalyst remaining on the polycrystalline silicon layer after the crystallization process, such that the property of the polycrystalline silicon layer is degraded. Thus, it is preferable to form the capping layer patterns to widths of 20 μm or less.

Accordingly, it is possible to form a polycrystalline silicon layer having a desired size of grain and desired uniformity of grain size in a desired region by variously combining the method of forming the capping layer containing the metal catalyst distributed at a density varying depending on the thickness and the method of pattering the capping layer in several forms, as described in FIGS. 2a to 2d and FIGS. 3a to 3c respectively, to form the capping layer pattern on the amorphous silicon layer.

Figure 4:
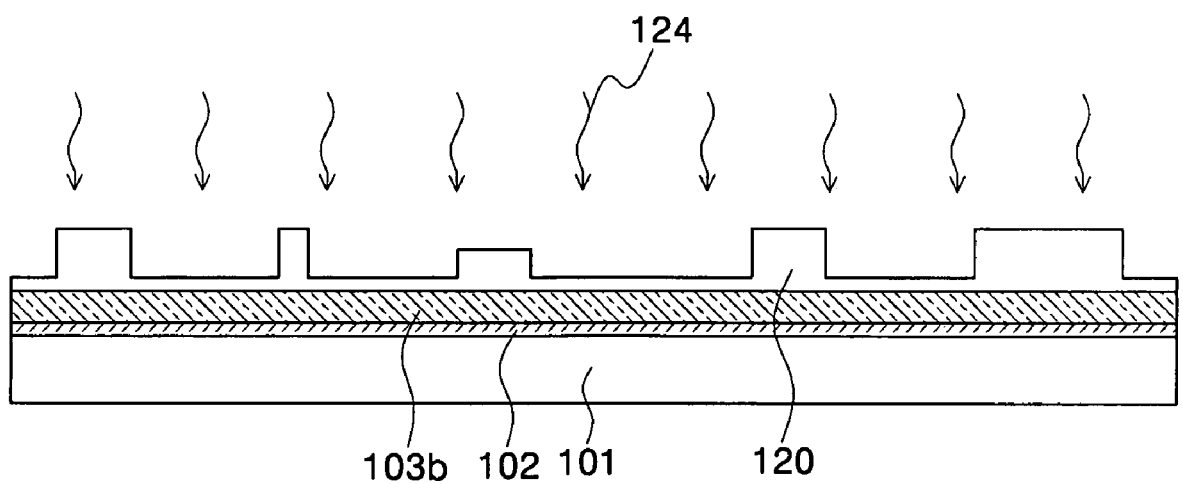
FIG. 4 is a cross-sectional view of a process of annealing and crystallizing a substrate having the amorphous silicon layer and the capping layer containing the metal catalyst.

FIG. 4 is a cross-sectional view of a process of annealing and crystallizing the substrate that has the amorphous silicon layer and the capping layer containing the metal catalyst. As shown in FIG. 4, a process is performed in which the substrate is annealed (124) to crystallize an amorphous silicon layer 103a into a polycrystalline silicon layer 103b, wherein the substrate has the capping layer containing the metal catalyst of several densities and distributions, which is formed using the method as described in FIGS. 2a to 2d, and several forms of capping layer patterns 120 formed by patterning the capping layer using the method as described in FIGS. 3a to 3c.

The annealing process may be performed by two processes of a first annealing process and a second annealing process. The first annealing process is performed at a temperature ranging from 200 to 800° C. to diffuse or penetrate the metal catalyst contained in the capping layer patterns, thereby forming seeds of metal silicide that induce crystallization at an interface of the amorphous silicon layer.

The second annealing process is then performed at a temperature ranging from 400 to 1300° C., such that the amorphous silicon layer is crystallized into the polycrystalline silicon layer by the seeds. At this time, the polycrystalline silicon layer will have a grain size of 5 to 400 μm.

The grain size and uniformity of the polycrystalline silicon layer is determined by the amount or density of the seeds and in turn, the amount or density of the seeds is determined by the size (i.e., width and interval) of the capping layer pattern and the distribution, density and amount of the metal catalyst in the capping layer pattern. Accordingly, the control of the grain size and uniformity of the polycrystalline silicon layer is realized by controlling the distribution, density and amount of the metal catalyst in the capping layer pattern using the method as described in FIGS. 2a to 2d and 3a to 3c.

At this time, the amount of the metal catalyst remaining on the polycrystalline silicon layer is $10^9$ to $10^{13}$ atoms/cm$^2$. This amount is an amount remaining even after the metal catalyst contained in the capping layer pattern is diffused or penetrated into the amorphous silicon layer by the annealing process to form the seeds, the amorphous silicon layer is crystallized by the seeds, and thereafter the capping layer is removed. The amount directly relates to the amount of the metal catalyst contained in the capping layer pattern.

Figure 5:
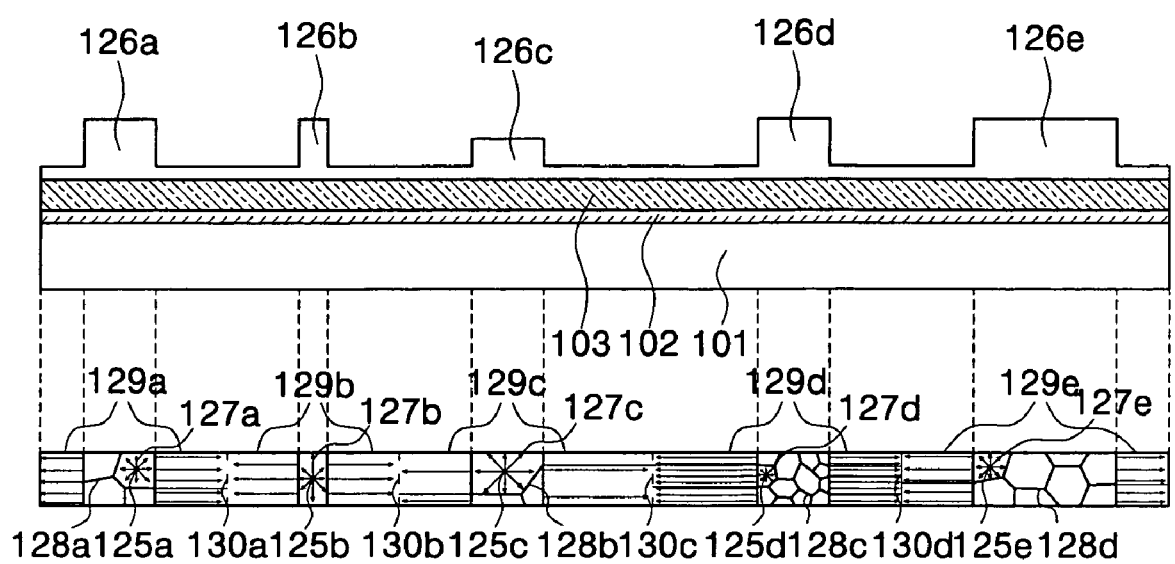
FIG. 5 is a cross-sectional and plan view illustrating the crystallization of an amorphous silicon layer in an annealing process.

FIG. 5 is a cross-sectional and plan view illustrating the crystallization of the amorphous silicon layer in an annealing process. As shown in FIG. 5, the metal catalyst, which is contained in the capping layer patterns described in FIGS. 3a to 3c by the first annealing process of FIG. 4, forms seeds 125a, 125b, 125c, 125d and 125e by means of diffusion or penetration. That is, the seeds are formed by the metal catalyst contained in capping layer patterns 126a, 126b, 126c, 126d and 126e.

In the second annealing process, the seeds then induce the amorphous silicon layer to crystallize into the polycrystalline silicon layer. As shown in FIG. 5, the crystallinity of the seeds is propagated to the amorphous silicon layer (127a, 127b, 127c, 127d and 127e) to is form the polycrystalline silicon layer. Although the crystal is described in FIG. 5 as being grown only in a plane (i.e., in all planar directions) from the seeds, the crystal, actually, is also grown vertically (in a depth direction).

The first capping layer pattern 126a, which is placed at the first position from a left end in FIG. 5, is a pattern that becomes a reference of the other capping layer patterns. The first capping layer pattern 126a is a capping layer pattern having at least one of the concentration distributions of the metal catalyst as shown in FIGS. 2a to 2d. The seed 125a is formed under the first capping layer pattern by the metal catalyst contained in the first capping layer pattern 126a, and the crystallinity of the seed is propagated (127a) during the second annealing process to form a grain 128a. The size of the grain 128a is determined by the number of the seeds produced in an area of a region beneath the first capping layer pattern (there are shown four seeds in FIG. 5) and thus the size of the grain may be controlled by adjusting the area of the region beneath the first capping layer pattern and the number of the seeds. In other words, a wide area and a fixed number of the formed seeds increase the size of the grain, and a fixed area and a reduced number of the seeds increase the size of the grain, as well. Further, the crystallinity formed by the first capping layer pattern is propagated to a non-pattern region adjacent to the first capping layer pattern, i.e., a region between the capping layer patterns. A first non-pattern region 129a is crystallized by the crystallinity propagated from four grains (i.e., the summed number of grains at both sides of the first capping layer pattern) to form two grains.

The second capping layer pattern 126b, which is placed at the second position from the left end in FIG. 5, is a pattern formed by controlling the width of the capping layer pattern as described in FIG. 3c. The second capping layer pattern 126b is a capping layer pattern formed to a width in which only one seed 125b is formed on the amorphous silicon layer in the underlying region. The crystallinity is propagated (127b) by the seeds, such that the amorphous silicon layer in a region beneath the second capping layer pattern 126b is grown into one grain 128b. Accordingly, even in the second non-pattern region, the crystallinity of grain is propagated such that only two grains are formed to obtain in a silicon layer, such as single crystalline, having no grain boundary in the second non-pattern region.

The first non-pattern region and the second non-pattern region exist in a region between the first capping layer pattern 126a and the second capping layer pattern 126b. Accordingly, at least one grain boundary is formed including a grain 130a adjacent to both crystallinity in the region between the first capping layer pattern 126a and the second capping layer pattern 126b (e.g., this is because at least one grain boundary is formed in a region to which the crystallinity propagated from each grain is adjacent even though only one grain exists in each region beneath the first capping layer pattern 126a and the second capping layer pattern 126b). At least one of the grain boundaries 130b, 130c and 130d is formed even in each region to which other non-pattern regions are adjacent to each other.

The third capping layer pattern 126c, which is placed at a third position from the left end in FIG. 5, is a pattern formed by controlling the thickness of the capping layer patterns, as described in FIG. 3b. The number of the seeds 125c on the amorphous silicon layer may be controlled by controlling its thickness. At this time, if the first capping layer pattern 126a and the metal catalyst have the same distribution and density, the thicker the thickness, the larger the size of the grain 128c.

The fourth capping layer pattern 126d, which is placed at the fourth position from the left end in FIG. 5, is a pattern formed by controlling the intervals between the capping layer patterns, as described in FIG. 3a. The fourth capping layer pattern itself may be formed to be the is same as any other capping layer patterns, but only intervals therebetween are different from each other. At this time, when the crystallinity of the polycrystalline silicon layer formed by the fourth capping layer pattern is desired to be wider, such a wide polycrystalline silicon layer may be easily formed with only the pattern formed to be wider, because a portion adjacent to the fourth capping layer pattern in the third non-pattern region formed by the propagation of the crystallinity of the polycrystalline silicon layer formed beneath the third capping layer pattern, and a portion adjacent to the third capping layer pattern in the fourth non-pattern region formed by the propagation of the crystallinity of the polycrystalline silicon layer formed beneath the fourth capping layer pattern are formed to be wider than other non-pattern regions.

The fifth capping layer pattern 126e, which is placed at the fifth position from the left end in FIG. 5, is a pattern formed by controlling the width of the capping layer patterns, as described in FIG. 3c. The grains 128e, which is been uniformly formed by the uniformly distributed seeds 125e, may be formed to have a larger width. That is, a polycrystalline silicon layer having a certain size and uniformity may be obtained by adjusting the production density and amount of the seeds by the adjustment of the metal catalyst in the capping layer pattern and by growing the crystal.

Figure 6:
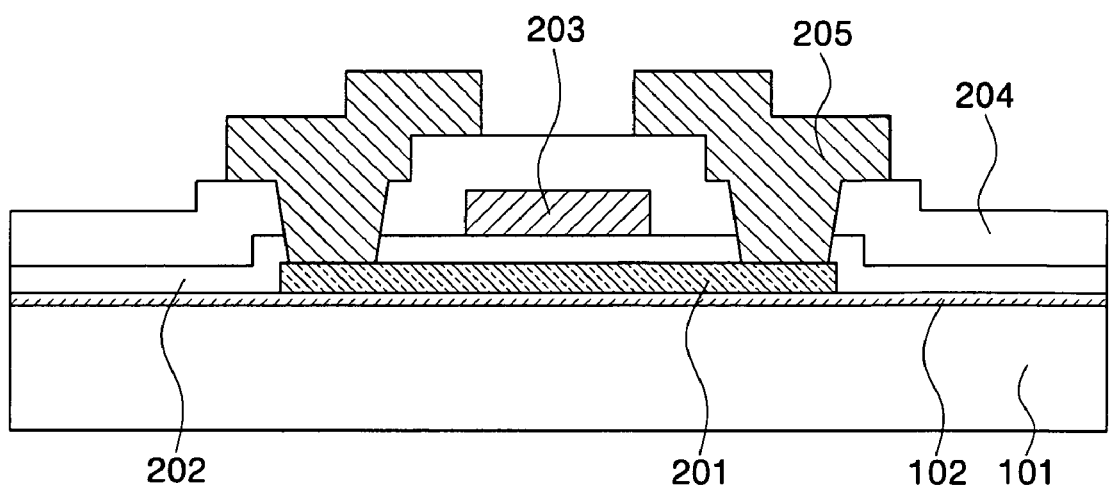
FIG. 6 is a cross-sectional view of a thin film transistor fabricated using a polycrystalline silicon layer formed according to the present invention.

FIG. 6 is a cross-sectional view of a thin film transistor fabricated using the polycrystalline silicon layer formed according to the present invention. As shown in FIG. 6, after the capping layer pattern is removed, a predetermined region (a region beneath the capping layer pattern or a region between the capping layer patterns) is patterned and a semiconductor layer 201 is formed of a polycrystalline silicon layer. The semiconductor layer 201 is formed of a polycrystalline silicon layer, wherein the polycrystalline silicon layer contains a metal catalyst having various distributions and densities as described in FIGS. 2a to 2d and 3a to 3c, and the polycrystalline silicon layer has the grains that has controlled size and uniformity by forming and crystallizing the capping layer patterns having various sizes, widths and positions.

A gate insulating layer 202 is then formed on the substrate, in which the gate insulating layer 202 is formed of a silicon oxide layer or a silicon nitride layer as a single layer or a multi-layer using a chemical vapor deposition method or a physical vapor deposition method.

Subsequently, a gate electrode forming material is deposited and patterned on the substrate to form a gate electrode 203. An interlayer insulating layer 204 having a structure of a single layer or a multi-layer is formed of a silicon oxide layer or a silicon nitride layer on the substrate.

Predetermined regions of the interlayer insulating layer 204 and the gate insulating layer 202 are then etched so that a contact hole is formed which exposes a predetermined region of the semiconductor layer. A material for forming source and drain electrodes is then formed and patterned on an entire surface of the substrate to form source and drain electrodes 205, resulting in a thin film transistor.

In the method of fabricating the thin film transistor according to the present invention, the crystallization process is performed using the capping layer patterns containing the metal catalyst, which has concentration and distribution varying depending on the thickness of the capping layer pattern, thereby improving the size and uniformity of grains. In addition, the polycrystalline silicon of desired size and uniformity is selectively formed in a desired position by one crystallization process, thereby the thin film transistor having excellent and desired properties.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. A thin film transistor, comprising:
a substrate;
a semiconductor layer formed on the substrate, the semiconductor layer comprising a first region and a second region separated by a grain boundary, and a density of a metal catalyst in the first region differs from a density of a metal catalyst in the second region;
the semiconductor layer is formed of a polysilicon layer crystallized by a super grain silicon (SGS) crystallization technique; and
a gate insulating layer, a gate electrode, an interlayer insulating layer, and source and drain electrodes formed on the semiconductor layer,
wherein the grain boundary extends through the entire thickness of the semiconductor layer, and
wherein the amount of the metal catalyst remaining on the first region is in a range of $10^9$ to $10^{13}$ atoms/cm$^2$, the metal catalyst is formed by using a capping layer having a concentration gradient where the density of the metal catalyst varies depending on a distance from an interface between the amorphous silicon layer and the capping layer.

2. The transistor according to claim 1, wherein grains of the first region have a different size than grains of the second region, the different sizes being formed from different densities of seeds arranged on an interface between an amorphous silicon layer and a capping layer pattern.

3. The transistor according to claim 2, wherein the seed density is formed by a difference between amounts of the metal catalyst in the capping layer pattern.

4. The transistor according to claim 3, wherein the difference of the metal catalyst amounts depends on a density of the metal catalyst in the capping layer pattern and a shape and a position of the capping layer pattern.

5. The transistor according to claim 1, wherein the polycrystalline silicon layer is formed by annealing the substrate and crystallizing an amorphous silicon layer into the polycrystalline silicon layer, the substrate having the amorphous silicon layer and a capping layer pattern comprising the metal catalyst with a concentration varying depending on a distance from a surface of the amorphous silicon layer.

* * * * *